(12) United States Patent
Peker et al.

(10) Patent No.: US 6,771,490 B2
(45) Date of Patent: Aug. 3, 2004

(54) METAL FRAME FOR ELECTRONIC HARDWARE AND FLAT PANEL DISPLAYS

(75) Inventors: Atakan Peker, Aliso Viejo, CA (US); William L. Johnson, Pasadena, CA (US)

(73) Assignee: Liquidmetal Technologies, Tampa, FL (US)

( * ) Notice: Subject to any disclaimer, the term of this patent is extended or adjusted under 35 U.S.C. 154(b) by 206 days.

(21) Appl. No.: 10/165,466

(22) Filed: Jun. 7, 2002

(65) Prior Publication Data

US 2003/0062811 A1 Apr. 3, 2003

Related U.S. Application Data

(60) Provisional application No. 60/296,859, filed on Jun. 7, 2001.

(51) Int. Cl.[7] .................................................. H05K 5/00
(52) U.S. Cl. ........................ 361/679; 361/683; 148/403; 148/561; 428/472; 428/469; 428/408; 428/472.1; 420/422; 420/417; 420/586; 228/101
(58) Field of Search ................................ 361/679–686; 148/403, 561, 522; 428/472, 469, 408, 472.1; 420/580, 422, 417, 586; 164/4.1, 113; 228/101

(56) References Cited

U.S. PATENT DOCUMENTS

| | | |
|---|---|---|
| 4,571,456 A | 2/1986 | Paulsen et al. |
| 5,237,486 A | 8/1993 | LaPointe et al. |
| 5,288,344 A | 2/1994 | Peker et al. |

(List continued on next page.)

FOREIGN PATENT DOCUMENTS

| | | | | |
|---|---|---|---|---|
| JP | 2001303218 | 10/2001 | | |
| WO | WO 3023081 A1 | * | 3/2003 | ........... C22C/45/00 |
| WO | WO 3029506 A1 | * | 4/2003 | ........... C22C/45/00 |

OTHER PUBLICATIONS

Hays et al., "Microstructure Controlled Shear Band Pattern Formation and Enhanced Plasticity of Bulk Metallic Glasses Containing in Situ Formed Ductile Phase Dendrite Dispersions," *Physical Review Letters*, Mar. 27, 2000, pp. 2901–2904, vol. 84, No. 13, The American Physical Society.

Inoue et al., "Bulk Amorphous Alloys with High Mechanical Strength and Good Soft Magnetic Properties in Fe–TM–B (TM=IV–VIII Group Transition Metal) System," *App. Phys. Lett.*, Jul. 28, 1997, pp. 464–466, vol. 71, No. 4, American Institute of Physics.

Shen et al., "Bulk Glassy $Co_{43}Fe_{20}Ta_{5.5}B_{31.5}$ Alloy with High Glass–Forming Ability and Good Soft Magnetic Properties," *Materials Transactions*, 2001, pp. 2136–2139, vol. 42, No. 10, Rapid Publication.

*Primary Examiner*—Lisa Lea-Edmonds
(74) *Attorney, Agent, or Firm*—Christie, Parker & Hale, LLP

(57) ABSTRACT

A metal frame for electronic hardware and a method of manufacturing such a frame wherein at least a portion of the frame is made of bulk-solidifying amorphous alloys or bulk-solidifying amorphous alloy-composites is provided. The metal frames of the invention are preferably made of bulk-forming amorphous alloys or bulk-forming amorphous alloy-composites having an elastic limit for the metal frame of at least about 1.5%, and preferably greater than about 2.0%, a ΔTsc of more than 30° C., and at least one of the following properties: a hardness value of about 4 GPA or more, and preferably 5.5 GPA or more; a yield strength of about 2 GPa or more; a fracture toughness of about 10 ksi-sqrt(in) (sqrt:squre root) or more, and preferably 20 ksi sqrt(in) or more; and a density of at least 4.5 g/cc or more.

77 Claims, 14 Drawing Sheets

U.S. PATENT DOCUMENTS

| | | | |
|---|---|---|---|
| 5,306,463 A | | 4/1994 | Horimura |
| 5,324,368 A | | 6/1994 | Masumoto et al. |
| 5,368,659 A | | 11/1994 | Peker et al. |
| 5,495,389 A | * | 2/1996 | Dewitt et al. ............... 361/683 |
| 5,515,303 A | * | 5/1996 | Cargin et al. ............... 361/683 |
| 5,567,251 A | | 10/1996 | Peker et al. |
| 5,567,532 A | * | 10/1996 | Peker et al. ............... 428/457 |
| 5,618,359 A | | 4/1997 | Lin et al. |
| 5,711,363 A | | 1/1998 | Scruggs et al. |
| 5,735,975 A | | 4/1998 | Lin et al. |
| 5,866,254 A | * | 2/1999 | Peker et al. ............... 428/378 |
| 5,886,254 A | | 3/1999 | Chi |
| 5,896,642 A | | 4/1999 | Peker et al. |
| 5,950,704 A | | 9/1999 | Johnson et al. |
| 6,027,586 A | | 2/2000 | Masumoto et al. |
| 6,154,265 A | | 11/2000 | Kamio et al. |
| 6,316,129 B1 | | 11/2001 | Seki et al. |
| 6,325,868 B1 | | 12/2001 | Kim et al. |

* cited by examiner

METAL FRAME FOR ELECTRONIC HARDWARE AND FLAT PANEL DISPLAYS

CROSS-REFERENCE TO RELATED APPLICATION(S)

This application claims the benefit of U.S. provisional application No. 60/296,859 filed on Jun. 7, 2001, the content of which is incorporated herein by reference.

FIELD OF THE INVENTION

This invention is directed to an improved metal frame for electronic hardware, and preferably to metal frames made of Fe and Zr-based bulk-solidifying amorphous alloys and bulk-solidifying amorphous alloy-composites.

BACKGROUND OF THE INVENTION

A conventional electronic device can be functionally separated for convenience into two portions: an electronics portion, which provides the functional utility of the electronic device; and an external frame portion which provides physical protection to the electronics portion. To provide optimum protection, the frame physically encapsulates the working components (such as including one or more microprocessors, memory devices, storage devices) of the electronic device: such as a portable computer, personal data assistant ("PDA"), or cell-phone.

For example, in portable personal computers, commonly referred to as notebook computers, a housing formed from a top case and a bottom case is used to support and house a screen, a computer, and interface devices. Typically, the case also forms a mounting structure for fastening together the various components comprising the computer. The various components, including the logic board and disk drives, are attached to either the upper or lower half of the case by means of screws or other such fastening means. Electromagnetic Interference ("EMI") protection is incorporated into the case by placing a sheet of shielding material inside both halves of the case or by surrounding the relevant components with a metal structure which isolates them from the environment. In constructing a typical notebook computer case, or any portable electronic device case, an effort is made to minimize overall weight while maximizing the device's processing power, memory storage and shock resistance.

In an effort to achieve this end a number of design elements are utilized. First, to minimize the size of the electronic device the electronic components are miniaturized and lightweight thin panel displays are incorporated into devices. Secondly, the structure used to mount and isolate the various components of the computer from shock is kept to a minimum, and in fact, the housing typically has molded-in reinforcements, ribs, and mounting bosses along its molded inner face to which components are mounted. Typically, the various circuit boards within the notebook computer are directly mounted with fasteners to the molded-in bosses and ribs. Finally, to minimize the weight of the device most of the cases for such computers have been constructed from pieces of a light weight very stiff plastics or composite materials.

Although these methods for constructing portable computers are acceptable, they leave room for improvement. For example, from a material standpoint, although plastic and composites are light weight and easily processable into the complex shapes required for most electronics cases, the structural strength and durability available from a plastic or composite material is typically not as good as that obtainable from metal. In addition, a separate EMI protection layer must be interposed between the case and electronics when using a plastic or composite material instead of a metal.

However, the weight and cost penalty for fabricating the entire case from metal is usually too great for a portable electronic device, except in such specialty markets as the military. For example, attempts have been made to correct the strength and durability problems associated with plastic cases by forming a portable computer where the case is made from die-cast metal upper and lower halves. Although this creates a relatively strong and durable computer, it weighs too much for easy portability and the cost of such a computer is too high. Other manufactures have made various subassemblies from sheet metal but the resulting computer is not noticeably stronger. In addition, most conventional metals are very difficult to adequately shape.

Recently work has been conducted on magnesium alloys because of their relatively low density and high strength properties. However, such alloys have much poorer plastic working properties than conventional alloys, such as Al-based alloys. Accordingly, the magnesium alloys are usually provided as die-castings at present. However, magnesium alloy castings are still limited to relatively thick products, because it is extremely difficult to cast magnesium alloys into thin products. In addition, casting defects such as pores and inclusions such as oxides, which are inevitable in casting, may be contained in the magnesium alloy castings and appear on the surface thereof The casting defects and the inclusions deteriorate the mechanical strength of the magnesium alloy castings, and if they appear on the surface, they adversely affect the corrosion resistance and surface appearance of the castings.

In addition, although such forged magnesium alloys, or other hybrid crystalline alloy materials may have improved corrosion resistance, and provide equivalent mechanical strength to conventional metals in a lighter frame, thus far, there has been no attention paid to the elastic limit (a material's ability to elastically deform prior to permanently deform) of such materials. Accordingly, cases for electronics products are generally formed with metals, which exhibit very poor elastic limits, reducing the ability of such cases to elastically store stress energy, and increasing the potential for permanent deformation of the electronics frame when subjected to a deforming stress.

Accordingly, a need exists for an electronics case which would improve the structural integrity and durability of a portable electronic device without increasing its weight or its manufacturing costs.

SUMMARY OF THE INVENTION

The current invention is directed to a metal frame for electronic hardware having improved physical mechanical properties including an elastic limit for the metal frame of at least about 1.5%, and preferably greater than about 2.0%; and preferably to highly processable metal frames wherein at least a portion of the frame is made of either a Zr/Ti or Fe-based bulk-solidifying amorphous alloys and bulk-solidifying amorphous alloy-composites.

In one embodiment, the bulk solidifying amorphous alloys are chosen from the family described by the molecular formula: $(Zr, Ti)_a(Ni, Cu, Fe)_b(Be, Al, Si, B)_c$, where a is in the range of from 30 to 75, b is in the range of from 5 to 60, and c in the range of from 0 to 50 in atomic percentages. In another such embodiment, the alloys may accommodate substantial amounts of other transition metals up to 20% atomic, and more preferably metals such as Nb, Cr, V, Co.

In another embodiment, the alloy family is $(Zr, Ti)_a(Ni, Cu)_b(Be)_c$, where a is in the range of from 40 to 75, b is in the range of from 5 to 50, and c in the range of from 5 to 50 in atomic percentages.

In another embodiment, composites of amorphous alloys are used to provide tailored stiffness, shock resistance and thermal conductivity properties to the frame. In such an embodiment, reinforcement materials for improved stiffness may be carbon fiber and preforms, or SIC fibers and preforms. In such an embodiment, the reinforcement materials preferably are from 20% up to 80% of the composite by volume. In a further embodiment, the direction and shape of the reinforcement materials may be tailored, for example, the materials may be aligned such that the desired properties (such as elastic modulus) are optimized in the direction parallel to length and width of the metal frame.

In another embodiment, the geometry of the frame may be tailored to provide a better combination of stiffness and flexibility. In such an embodiment, any desirable configuration may be utilized, such as honeycomb and wavy structures.

In another embodiment, the metal frame may further compromise other parts made of from different materials such as plastics, aluminum etc.

In another embodiment, the amorphous alloys are chosen to provide a hardness value of about 4 GPa or more, and preferably 5.5 GPa or more.

In another embodiment, the amorphous alloys are chosen to provide a yield strength of about 2 GPa or more.

In another embodiment, the amorphous alloys are chosen to provide a fracture toughness of about 10 ksi-sqrt(in) (sqrt:squre root) or more, and preferably 20 ksi sqrt(in) or more.

In another embodiment, the amorphous alloys are chosen to provide a density of at least 6.5 g/cc or less and preferably 4.5 g/cc or less.

In another embodiment, the amorphous alloys are chosen to have at least two properties one being the elastic limit, and the other chosen from the group of: hardness, yield strength, fracture toughness, and density within the above-referenced ranges.

In another embodiment, the amorphous alloys are chosen to have at least three properties one being the elastic limit, and the other two chosen from the group of: hardness, yield strength, fracture toughness, and density within the above-referenced ranges.

In another embodiment, the metal frame of the invention comprises of at least one part to form the metal frame assembly. In an embodiment in which the frame is made of at least two parts, one part may separately incorporate the electronic hardware and one part may incorporate the flat panel display. In such an embodiment, the parts of the metal frame may be joined by various techniques such as by bolting, clamping, adhesives, riveting or welding to secure its contents.

In another embodiment, the amorphous alloy frames are designed to provide structures, such as, ribs or support platforms, for the attenuation of shock and vibration for inner sensitive components such as hard drives.

In another embodiment, the amorphous alloys and composite frames are manufactured into sophisticated designs (such as incorporating more intricate features in shape-both functional, ergonomics and aesthetics), such as features of less than a micron in dimension.

In another embodiment, the invention is directed to a frame designed specifically for a portable electronic device, such as a PDA, a cellular phone, or a notebook computer.

In another embodiment, the invention is directed to a method of manufacturing an electronics device frame of an amorphous alloy. In such an embodiment, the amorphous alloy may be cast or molded around the materials glass transition temperature to duplicate details or provide more complex metal case designs.

In another embodiment, the metal frame is fabricated from sheets of amorphous alloys and composites by stamping and/or die forming operations. In such an embodiment, preferably the stamping and die-forming operations are performed around the glass transition temperatures. In another such embodiment, the metal frame may also be fabricated from sheets of amorphous alloys an composites by machining and cutting operations, such as, for example, water-jet, laser cutting, and Electro Discharge machining. The metal frame may also be fabricated by various forms by casting operations such as metal mold casting and melt infiltration process for amorphous alloy composites.

In another embodiment, the metal frame is machined, cut, stamped or die-formed with various slots and holes to provide improved cooling for the heat generated from the operation of electronic hardware, flat panel display. In such an embodiment, the metal frame may also be machined, cut, stamped or die-formed with various slots and holes to provide improved performance for internal sound system and speakers. Finally, in another such embodiment, the metal frame may be machined, cut, stamped or die-formed with various slots and holes to provide space for keyboard, mouse, track pad and other various accessories and other such attachments.

BRIEF DESCRIPTION OF THE DRAWINGS

These and other features and advantages of the invention will be apparent from the following detailed description, appended claims, and accompanying drawings, in which:

DETAILED DESCRIPTION OF THE INVENTION

Figure 1:
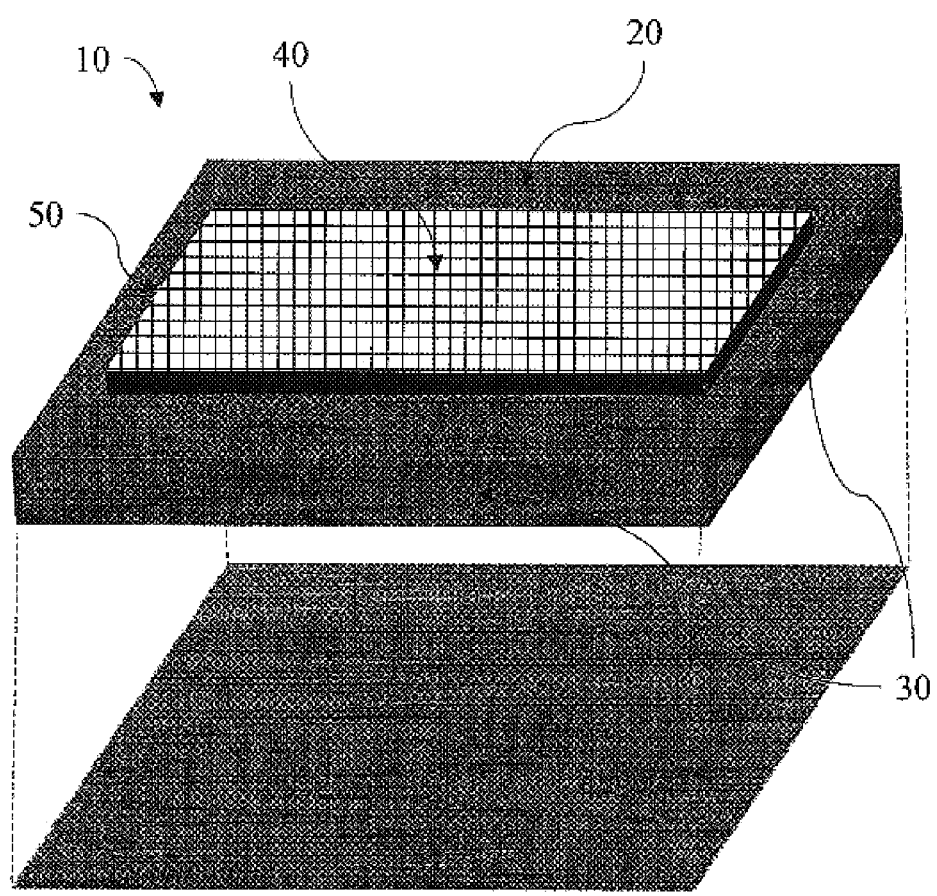
FIG. 1 shows a schematic of a keyboard frame in accordance with one embodiment of the invention.

The present invention is directed to a frame for an electronics device having improved physical mechanical properties wherein at least a portion of the frame is formed of a material having an elastic limit for the metal frame of at least about 1.5%, and preferably greater than about 2.0%; and preferably to a frame made of a highly processable material such as either Zr/Ti or Fe-based bulk-solidifying amorphous alloys and bulk-solidifying amorphous alloy composites.

bulk-solidifying amorphous alloy or composite bulk-solidifying amorphous alloy material. These frames are referred to herein as electronics frames/cases or bulk-solidifying amorphous frames/cases.

Representative examples of the electronics frames according to this invention are shown in FIGS. 1 to 5. As shown, each metal frame 10 defines at least one enclosure 20 defined by the walls 30 of the metal frame within which the components 40 of the electronic device may be contained, and at least one opening 50 to allow access or interaction with the electronic component 40 contained therein. However, although the metal frames of this invention all contain these basic components, as shown in FIGS. 1 to 5, the case itself; the number, size and shape of the enclosures and openings; and the nature, shape, and size of the component electronics contained therein may vary depending on the nature of the electronic device. For example, the frames of this invention may be used in any electronic device, such as, for example, data storage and manipulation devices such as PDAs and notebook computers; multimedia recording devices such as digital cameras and video cameras; multimedia players such as CD and DVD players; communications devices such as pagers and cellular phones; etc.

Figure 2:
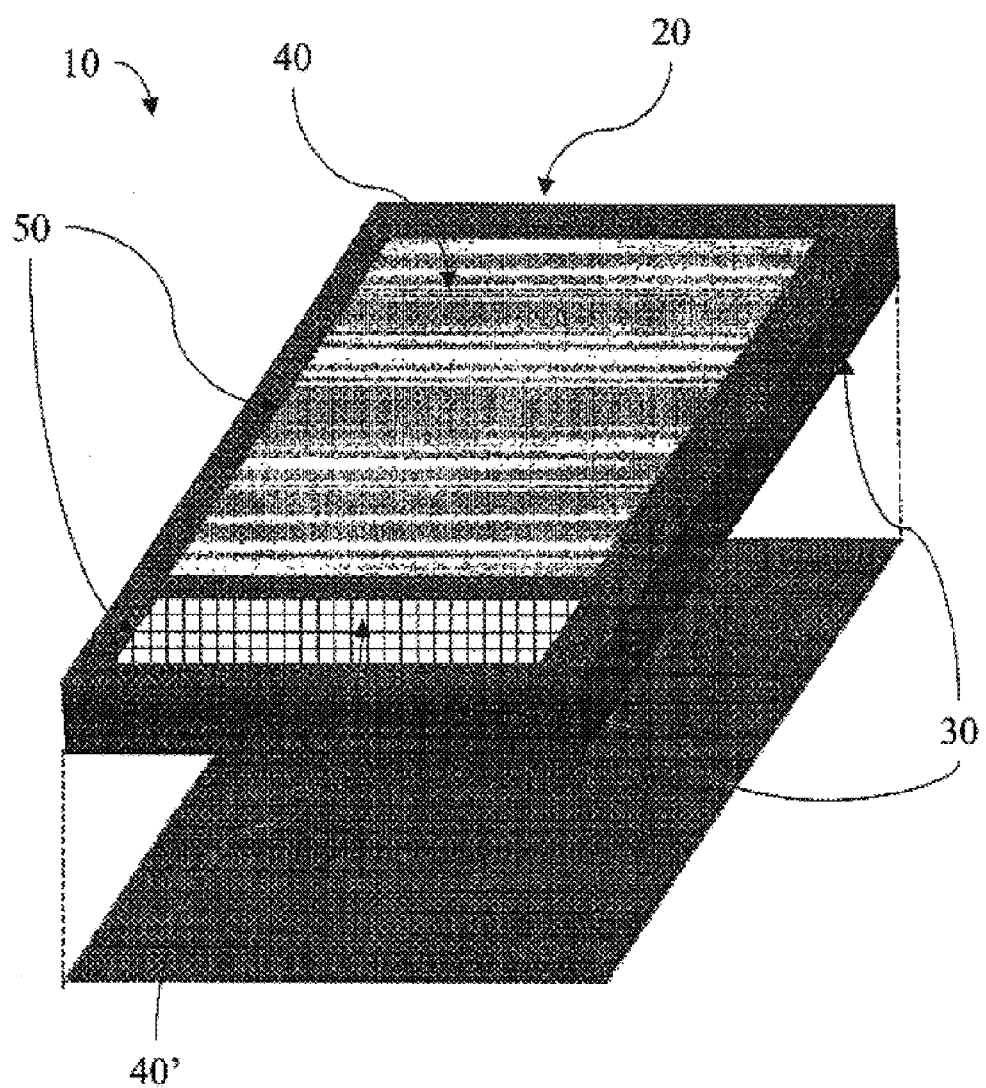
FIG. 2 shows a schematic of a flat panel screen frame in accordance with one embodiment of the invention.
Figure 3:
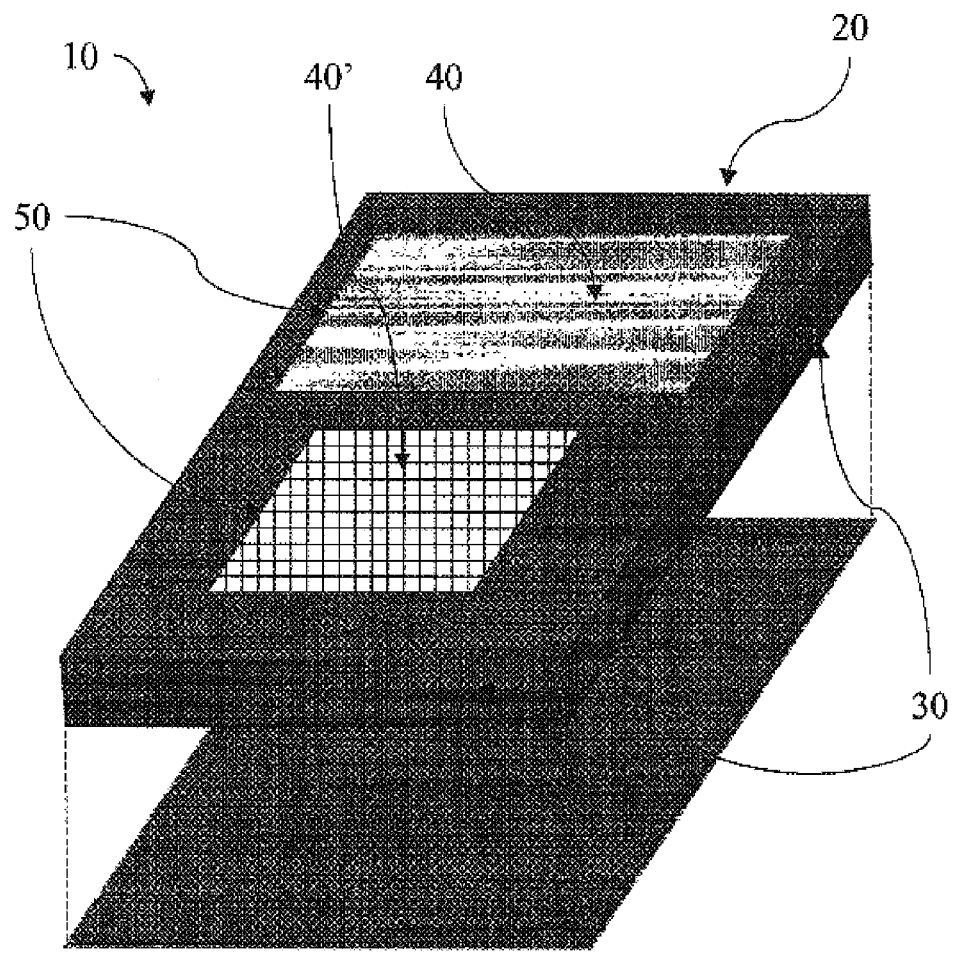
FIG. 3 shows a schematic of a combination keyboard/flat panel display frame in accordance with one embodiment of the invention.
Figure 4:
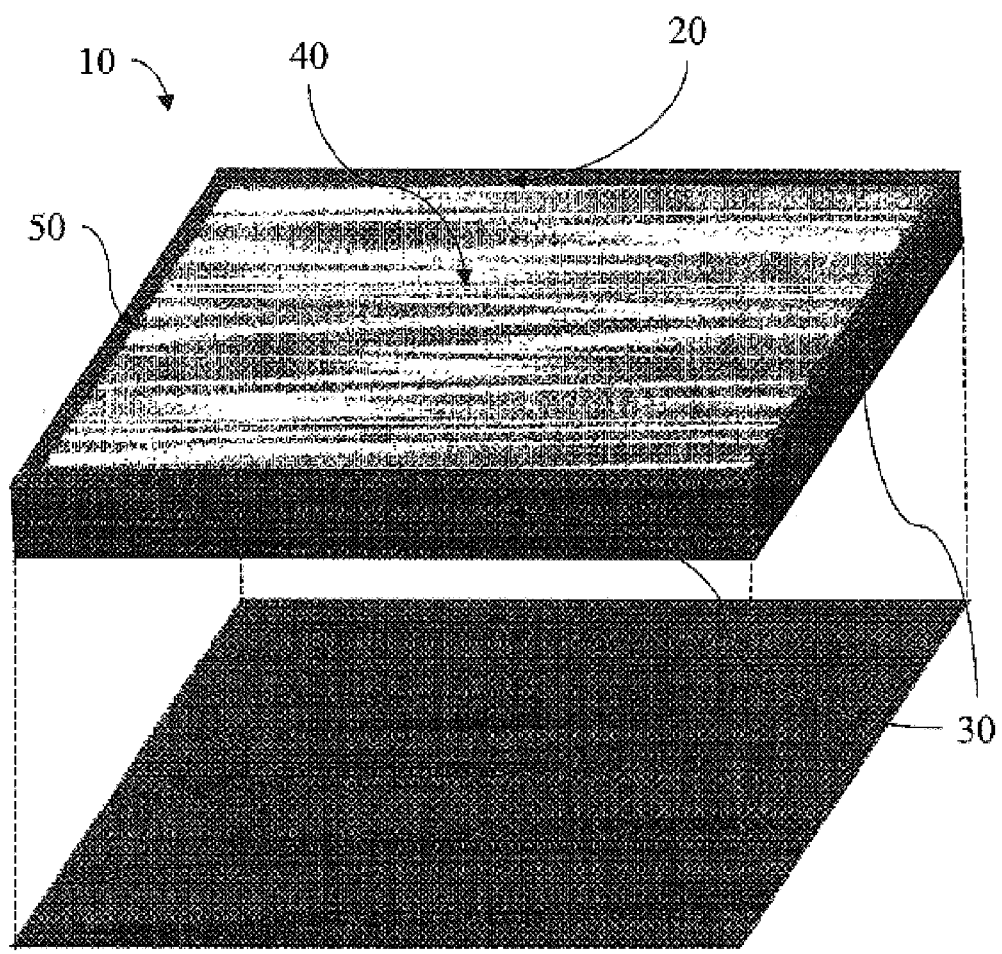
FIG. 4 shows a schematic of a flat panel screen frame in accordance with one embodiment of the invention.

FIGS. 1 to 4 show exemplary embodiments of suitable metal frame designs for a variety of electronic devices. For example, FIG. 1 shows a case 10 having a single opening 50 for a user interface, such as a key board 40, which could be used as a stand alone device, such as a remote control or as a component to a stationary or portable computer. FIG. 2 shows a case 10 having two openings 50 for a flat panel display 40 and a user interface or access port 40', such a design might be used for a portable DVD player or as a component of a portable computer. FIG. 3 shows a case for a cell phone or a PDA, in which openings 50 are provided for both a flat panel display 40 and a user interface, such a series of control buttons 40'. Meanwhile, FIG. 4 shows a case 10 having a single large opening 50 for a view panel, such as for a flat panel television.

As shown, each of the proposed frame designs incorporates a variety of sized and shaped enclosures 20, a variety of size and shaped walls 30, a variety of size and shaped electronic components 40 and a variety of size and shaped openings 50. And, although only devices have two or fewer openings are shown, it should be understood that the number and placement of such openings is only dependent on the type of use proposed. For example, additional openings might be provided to allow proper cooling, proper maintenance, or to allow the attachment of any size, shape, or number of accessories.

Figure 5:
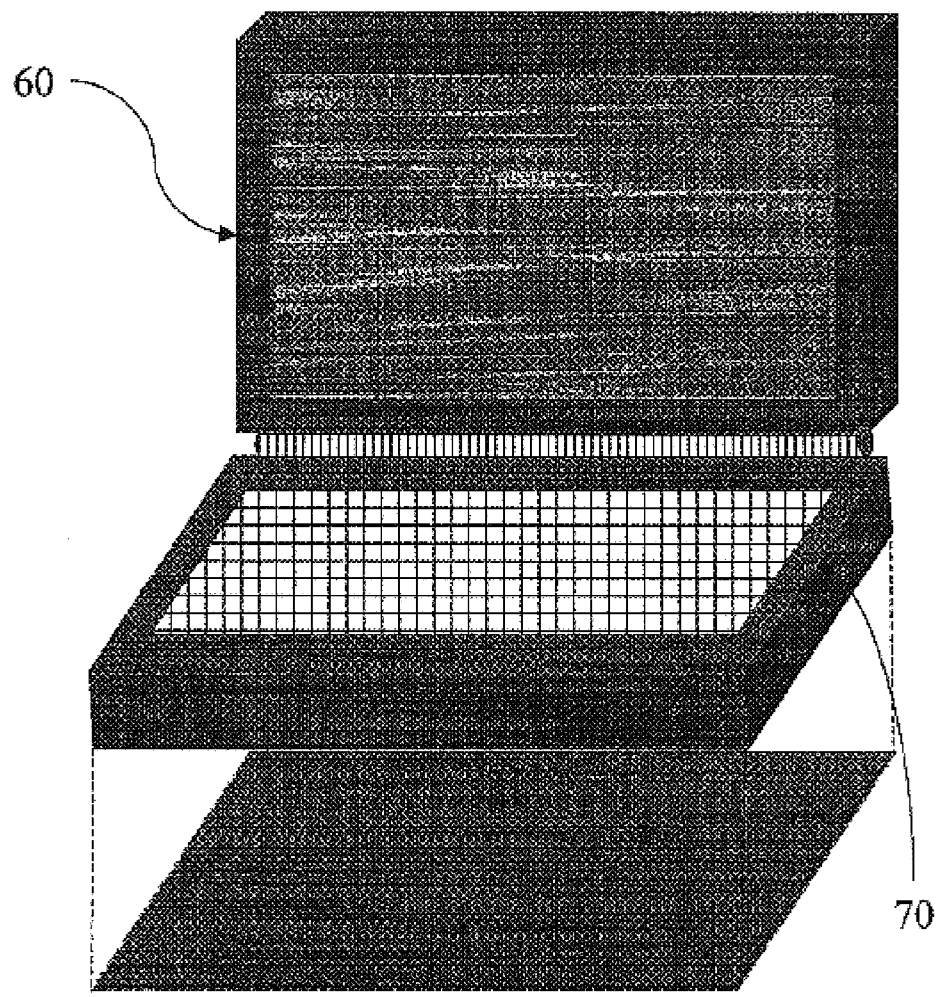
FIG. 5 shows a schematic of a hinged frame in accordance with one embodiment of the invention.

FIGS. 1 to 4 show case and frame designs in which the working components of the electronic device are incorporated into a single structure, however, they may also be housed in separate structures which may be separate or attached. An example is shown in FIG. 5. FIG. 5 shows a case having two separate portions connected via a hinge. One portion 60 of the case is designed to house a flat panel display, and the second portion 70 is designed to house a user interface and other working components.

While detailed construction diagrams of the cases are not provided, it should be understood that where necessary, such as where the frame is made of at least two parts (as shown in FIG. 5), the parts of the metal frame may be joined by various techniques such as by bolting, clamping, adhesives, riveting or welding to secure its contents. In addition, the alloy frames may be designed to provide structures, such as, ribs or support platforms.

Although only the front perspective view of the above exemplary cases is shown, it should be understood that the metal frame may cover the edges and back-side of the viewing panel. In addition, although the Figures show only five examples of potential case designs, it should be understood that the metal frames of the current invention may take any shape and size suitable for enclosing an protecting the electronic components of an electronic device. For example, suitable metal frame designs for portable computers are disclosed in U.S. Pat. Nos. 5,237,486 and 4,571,456 (each of whose disclosures is incorporated by reference in its entirety).

In addition to the cases and frames shown in FIGS. 1 to 5, which are designed as the primary enclosure to encase the electronic components, it should be understood that the electronics frames of the current invention may be utilized to encase an already fully encased electronic device. For example, the current invention could be directed to an additional carrying case for enclosing a PDA, cellular phone, or notebook computer, thus providing an additional layer of protection to the device.

The above discussion has generally focused on the structure, design, and function of the electronics frames in the present invention. However, as discussed in the background, a major problem associated with electronics frames generally is in balancing the durability of the case with the overall weight of the case. Cases and frames for electronics devices are required to have a certain level of durability per unit weight, such that the frame provides adequate protection, but remains suitably light weight.

In determining the durability of the case there are a number of important physical parameters to consider in choosing a frame material. For conventional electronics frames and cases, engineers typically consider a higher "ultimate tensile strength ($\sigma_{uts}$), which is defined as the maximum amount of stress a material may be subject to prior to breakage; and a higher elastic modulus (Young Modulus or Flexural Modulus depending on the load geometry) of primary importance in choosing a material. Further, in order to make light weight frames, materials are chosen to provide a higher specific ultimate tensile strength (the ratio of ultimate tensile strength to density) and a higher specificelastic modulus (the ratio of elastic modulus to density) for conventional electronics frames. These material parameters typically indicate maximum overall load-carrying ability before breakage and overall deflection of the frame, respectively. However, specific design features of the frame also play an important role (and possibly a dominant role) in determining the maximum overall load-carrying ability (before breakage), and overall deflection of the frame.

For example, an I-beam is more effective than a solid bar at providing overall load carrying ability to minimize deflection for a given weight of the same material. Accordingly, such intricate design features can readily and effectively provide some remedy for a material's structural shortcomings, provided the material can be processed and fabricated into the complex shapes necessary.

While these properties indicate a frame's ability to carry a maximum overall load and also provide some measure of the frames overall ability to deflect or deform, the do not give sufficient indication for the frame's general durability and ability to protect the encased electronic components from the stresses caused by the physical environment, such as: intrusions, dents, punctures, etc. In addition, these parameters do not adequately define a case's reaction to deformation, such as that caused by a deforming stress. It is also important to note that while the design features described above are able to address some deficiencies in the physical properties of the material chosen, they cannot be readily utilized to remedy problems associated with inadequate durability and inadequate protection from the physical environment.

Figure 6:
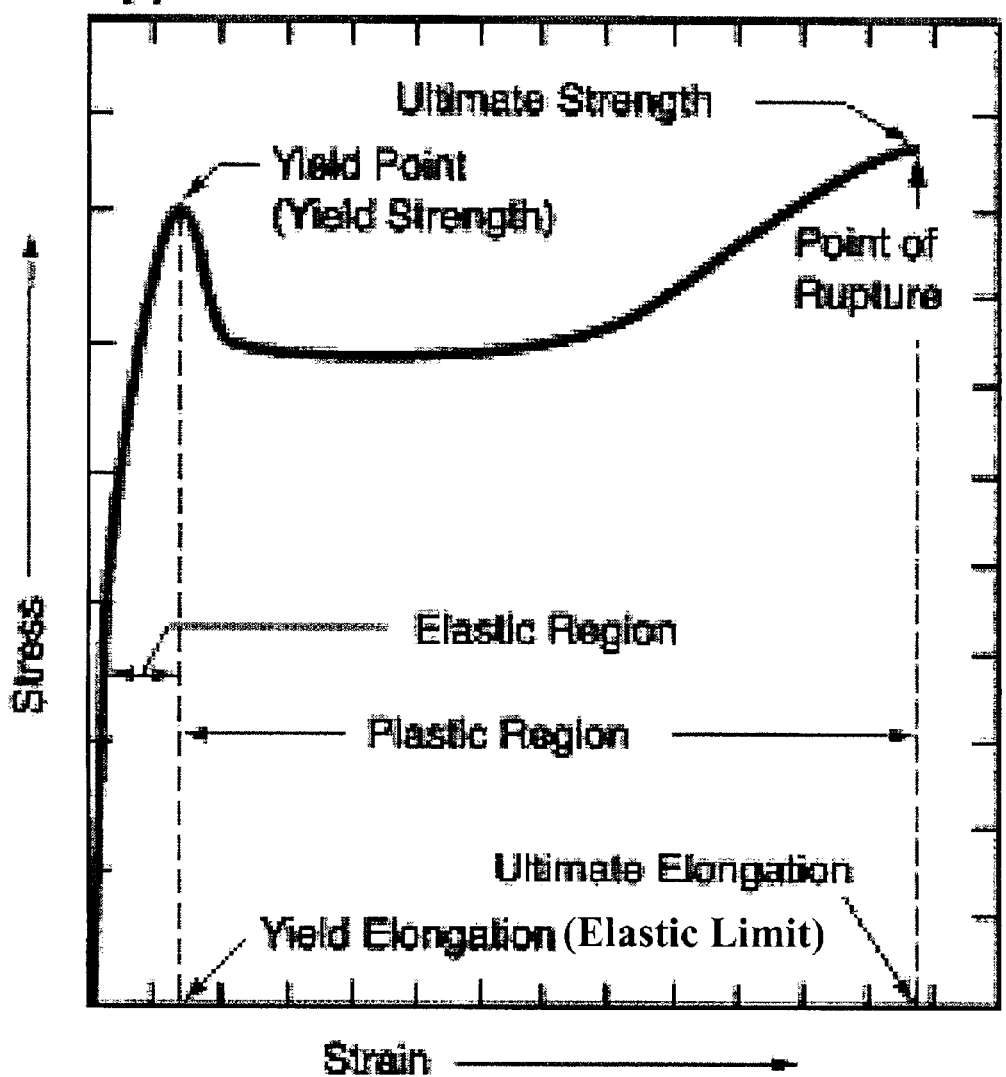
FIG. 6 shows a graphical depiction of the properties of the amorphous materials of the current invention.

To describe a case's reaction to such deformations, it is necessary to consider the elastic strain limit ($\epsilon_f$) of the material used. The elastic strain limit is defined as the amount of physical deformation a material is capable of sustaining prior to permanent deformation. The relationship of the elastic limit to the yield strength is shown graphically in the stress/strain curve depicted in FIG. 6.

Figure 7:
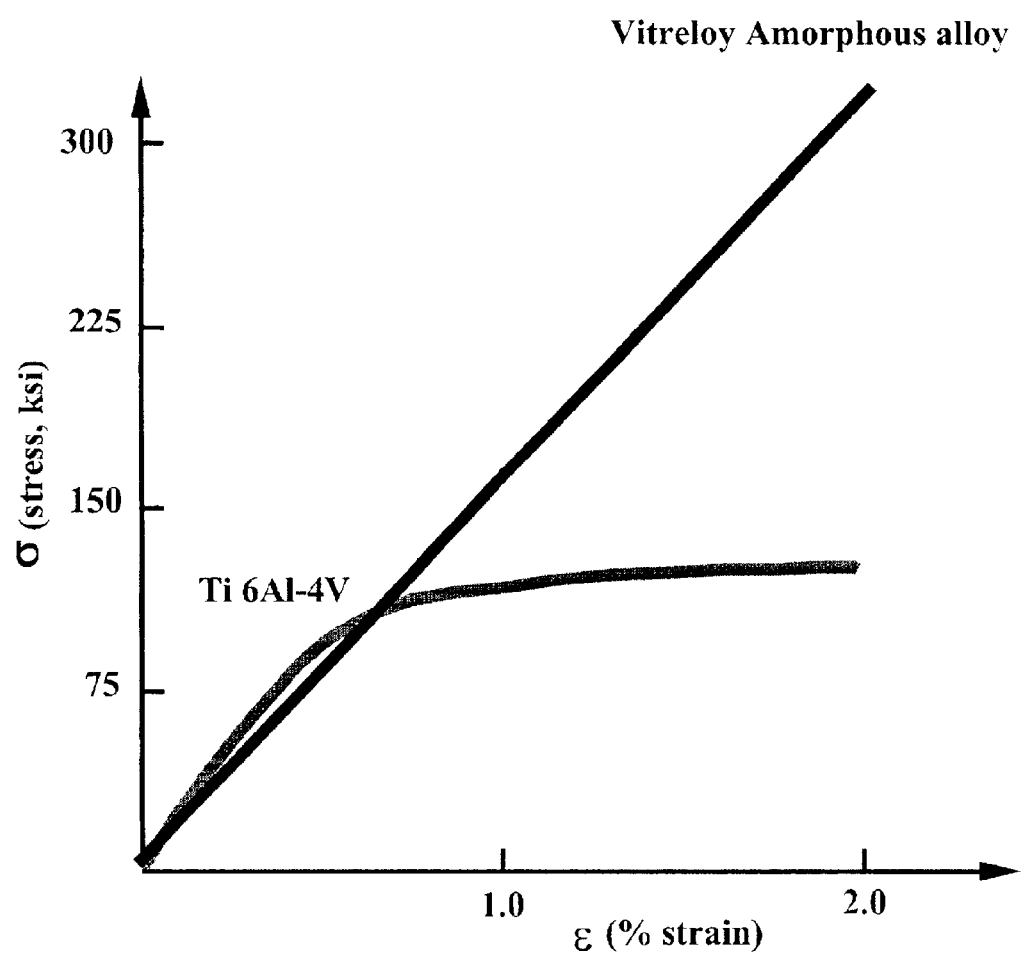
FIG. 7 shows a graphical comparison of the properties of the amorphous materials of the current invention and conventional materials.

The importance of the elastic strain limit in determining the suitability of a material for the production of an electronics case is best illustrated in FIG. 7. This figure shows stress-strain curves comparing a very hard lightweight material, such as a conventional Ti alloy, which is often used as a premium material in the production of electronics cases, versus a bulk-solidifying material as described in the current invention. As shown, the conventional material has a relatively high yield strength, however, if the elastic limit of the material is low, then any slight deformation of the material will cause a permanent deformation. In contrast, the cases of the current invention are designed to be capable of having an even high yield strength and of sustaining relatively high elastic deformations.

Figure 8:
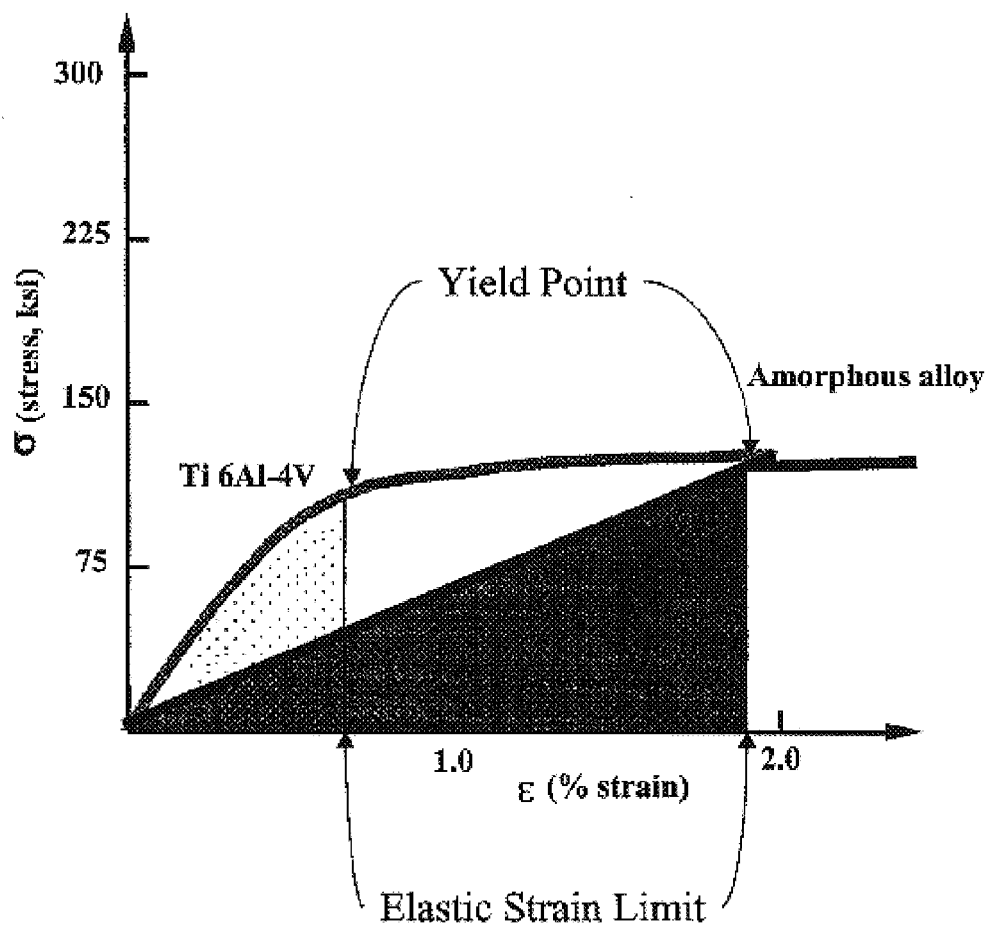
FIG. 8 shows a graphical comparison of the properties of the amorphous materials of the current invention and conventional materials.

The importance of elastic limit in providing improved durability of the cases according to the current invention is graphically shown by comparing the schematic curves in FIG. 8. Specifically, the area under the two graphed curves in FIG. 8 represents the ability of the two imaginary materials to elastically (i.e., without being permanently damaged) store energy from a stress such as a fall or impact. As shown, by choosing a material having a high elastic limit, the final electronic frame is capable of absorbing significantly more energy (while elastically deforming) than the conventional material having an equally high yield strength. Accordingly, a case made in accordance with the current invention is to be formed of a material having an elastic limit of at least 1.5%, thereby providing a case that is much less susceptible to permanent deformation or complete failure during use.

All of the above-mentioned properties can be further defined by observing the density of the material ($\rho$), which defines the materials weight per volume. For example, yield strength or elastic limit to weight ratio can be utilized to determine the suitability of an amorphous alloy material for use in the electronic frames of the current invention. One very useful measurement of a material is defined by the ratio of elastic limit to density, as defined by the equation below:

$$\frac{\epsilon_f}{\rho} \tag{1}$$

In addition, the ratio of yield strength to density might also be utilized in combination with the above ratio to produce improved frames:

$$\frac{\sigma_y}{\rho} \tag{2}$$

Either the elastic limit ratio or, preferably, a combination of the above ratios might be utilized to determine a range of suitable materials.

In addition to desirable mechanical properties, discussed above, corrosion resistance is very important to electronics frames, and particularly portable electronics devices subject to being exposed to harsh environments and inclement operating conditions.

Finally, as discussed in the background, a second major problem associated with electronics frames made from metal generally is in efficiently manufacturing the complex shapes required. To manufacture these complex shapes it is best to use molding and casting methods, otherwise extensive post-processing machining will be required, such as in forging methods. However, most conventional materials, such as Al-based alloys have very poor molding and casting properties. Specifically, these conventional alloys show significant Accordingly, the material chosen for the cases and frames must have a minimum processability.

The processability of a material may be defined in many ways, such as, for example, by the minimum size of the features the material is capable of reproducing from the die cavity, by the shaping temperatures or strain rates required during forming, and by the dimensional tolerance of the finished product the material is capable of forming.

For example, because of the fine dimensions required of the electronics cases of the current invention, only materials having a minimum processability can be utilized. For example, in one embodiment of the invention, only those materials capable of replicating surface features on the order of 100 microns would be suitable for forming the electronics frames of the current invention.

To provide suitable mechanical durability, corrosion resistance, and processability, the current invention is directed to an electronics frame made of a bulk-solidifying amorphous alloy, and particularly to an electronics frame made of a Zr/Ti or Fe-based bulk-solidifying amorphous alloy.

Bulk-solidifying amorphous alloys refer to the family of amorphous alloys that can be cooled at cooling rates of as low as 500 K/sec or less, and retain their amorphous atomic structure substantially. Such bulk-solidifying amorphous alloys can be produced in thicknesses of 0.5 mm or more, substantially thicker than conventional amorphous alloys having a maximum castable thickness of 0.020 mm, and which require cooling rates of $10^5$ K/sec or more. In addition, because of the cooling rate properties of bulk-solidifying amorphous alloys, such materials may be processed via a number of different techniques, including: casting, molding and even thermoplastic casting such as is utilized with plastic materials.

Figure 9:
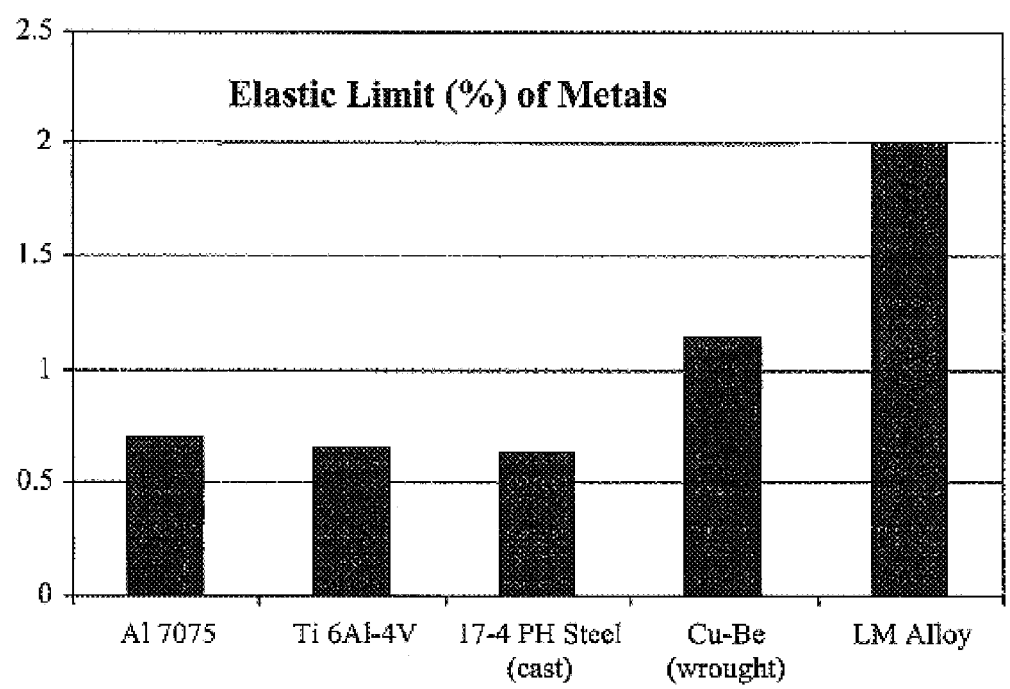
FIG. 9 shows a graphical comparison of the properties of the amorphous materials of the current invention and conventional materials.

As shown in FIG. 9, bulk-solidifying amorphous alloys have an elastic strain limit higher than 1.5% and generally their elastic strain limit is about 2.0%. In comparison, conventional metals have elastic strain limit of 0.6% or less.

Figure 10:
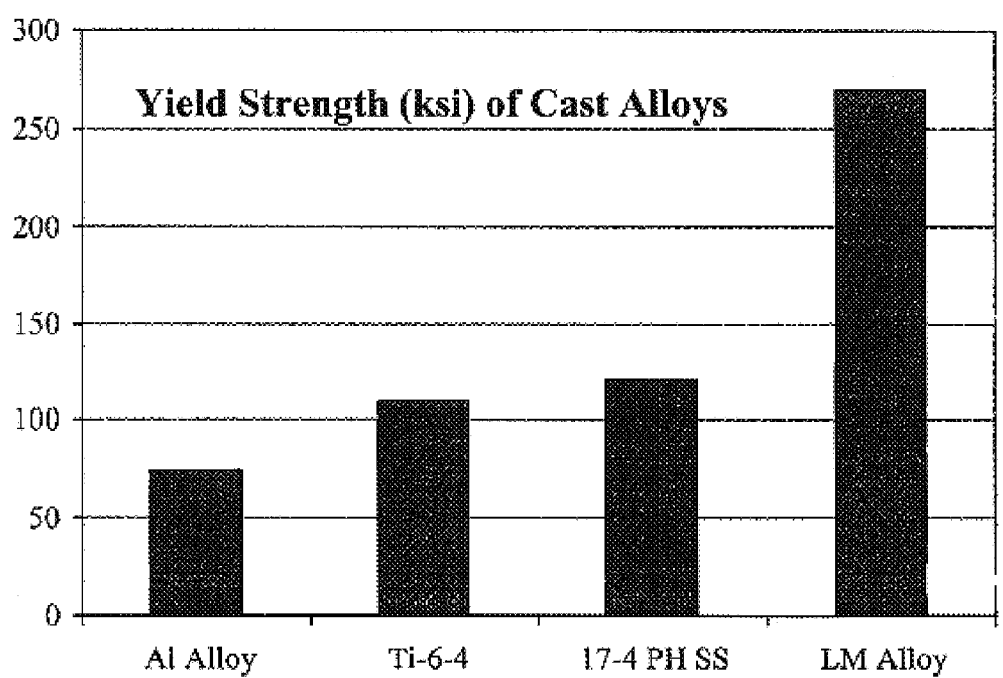
FIG. 10 shows a graphical comparison of the properties of the amorphous materials of the current invention and conventional materials.

As discussed above, the elastic strain limit is an important factor, as a higher elastic limit provides a more effective constraint for electronics devices. For example, if an electronics case is subject to a fall or an impact, the surrounding metal will be forced to stretch out and their ability to store that impact and respond elastically will be an important factor to impede permanent damage to the electronics components encased therein. Accordingly, the higher the elastic limit, the better the electronic case will be at holding the internal electronics components safely. In addition, as shown in FIG. 10, bulk-solidifying amorphous alloys have yield strengths of 1.6 GPa and more, much higher than conventional metals. The higher the yield strength of the material, the higher resistance against potentially damaging forces. Moreover, because of the unique atomic structure of these materials, bulk-solidifying amorphous alloys provide better attenuation of shock and vibration for shock sensitive electronic components, such as data storage devices, such as CD or DVDs or standard hard drives.

Accordingly, bulk-solidifying amorphous alloys have the unique combination of high yield-strength and high elastic limit of bulk amorphous metals make them highly useful as a surrounding metal for electronics components. Exemplary embodiments of amorphous alloys are disclosed in U.S. Pat. Nos. 5,288,344; 5,368,659; 5,618,359; and 5,735,975; all of which are incorporated herein by reference.

In accordance with the above discussion, any bulk-solidifying amorphous alloys which have an elastic limit when formed as an electronics frame of at least about 1.5%, and preferably greater than about 2.0%, and at least one physical property selected from the following: a hardness value of about 4 GPa or more, and preferably 5.5 GPa or more; a yield strength of about 2 GPa or more; and a fracture toughness of about 10 ksi-sqrt(in) (sqrt:squre root) or more, and preferably 20 ksi sqrt(in) or more, may be used in the current invention.

In addition, a density of about 8.5 g/cc or less should be chosen such that the material provides a high strength to weight ratio. Accordingly, in the case of the yield strength to density of a material (Equation 1), a ratio of at least 0.2 would be preferable, whereas the ratio of elastic limit to density (Equation 2) would preferably be at least 0.17.

In a preferred embodiment, the bulk-solidifying amorphous alloys are chosen to have at least two of the above properties in combination with the elastic limit within the above-referenced ranges. In a most preferred embodiment, the bulk-solidifying amorphous alloy or amorphous alloy composite chosen has at least three of the above properties in combination with the elastic limit within the above-referenced ranges.

These properties can be combined in a variety of ways depending on the type of electronics case desired. For example, in one preferred embodiment, the electronic metal frame is made of a metal with an elastic strain limit of 1.5% or higher. In another with the case is made with a metal having an elastic strain limit of 1.5% or higher and a hardness of 4 GPa or higher. In another with a metal having an elastic strain limit of 1.5% or higher and a hardness of 5.5 GPa or higher. In yet another the case is made with a metal having an elastic strain limit of 1.5% or higher and a fracture toughness of 10 ksi-sqrt (in) or higher. In still another with a metal having an elastic strain limit of 1.5% or higher and a fracture toughness of 20 ksi-sqrt (in) or higher. In still another with a metal having an elastic strain limit of 1.5% or higher and a yield strength of 2 GPa or higher.

In an embodiment requiring multiple properties the electronic metal frame could be made of a metal with an elastic strain limit of 1.5% or higher, and with an hardness of 4 GPa or higher, and with an fracture toughness of 10 ksi-sqrt (in) or higher; or with an elastic strain limit of 1.5% or higher, and with an hardness of 5.5 GPa or higher, and with an fracture toughness of 20 ksi-sqrt (in) or higher.

In an embodiment in which the density of the material is taken into accound the electronic metal frame could be made of a metal with an elastic strain limit of 1.5% or higher and with a density of 6.5 g/cc, or alternatively 4.5 g/cc or less In short, the electronic cases are to use a metallic material with an elastic limit of 1.5% or higher. Further, in a preferred embodiment of the invention the metallic material used in the electronic hardware has a hardness of 4 GPA, and more preferably a hardness of 5.5 GPa or more. Still in the more preferred embodiment, the metallic material has also a fracture toughness of 10 ksi-sqrt (in) or higher and more preferably 20 ksi-sqrt (in) or higher. In still more preferred embodiment of the invention the density of the metallic material is less than 6.5 g/cc. It should be understood that these are material properties desired in frame and not the structure property of the metal frame. The use of bulk-solidifying amorphous alloys uniquely provide such desired properties of the current invention.

Figure 11:
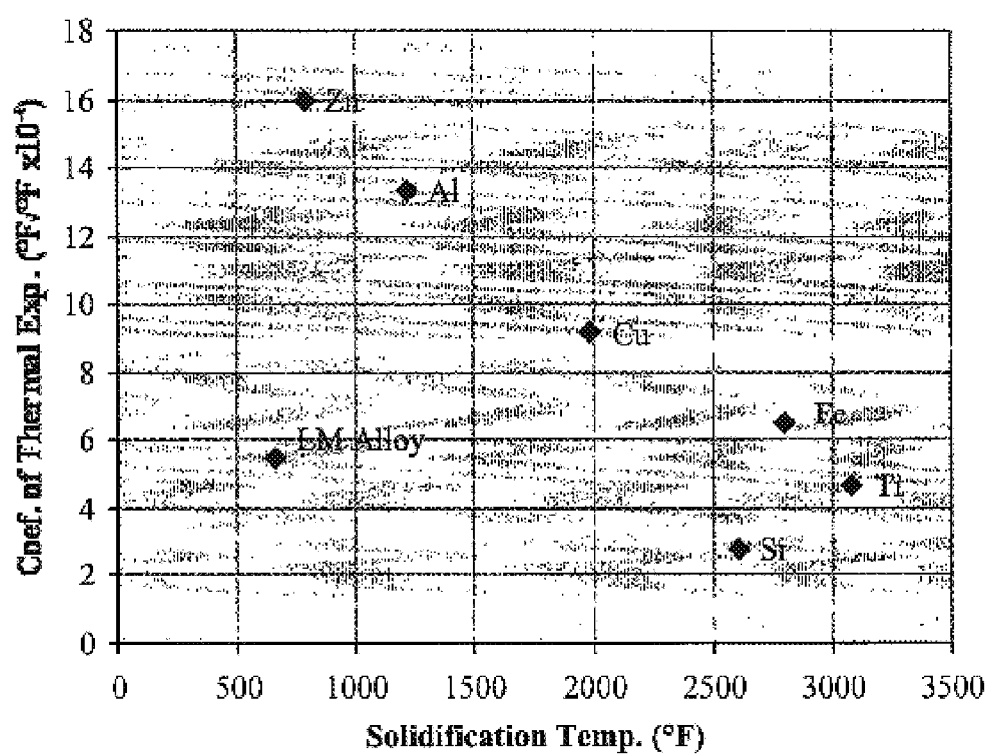
FIG. 11 shows a graphical comparison of the properties of the amorphous materials of the current invention and conventional materials.
Figure 12:
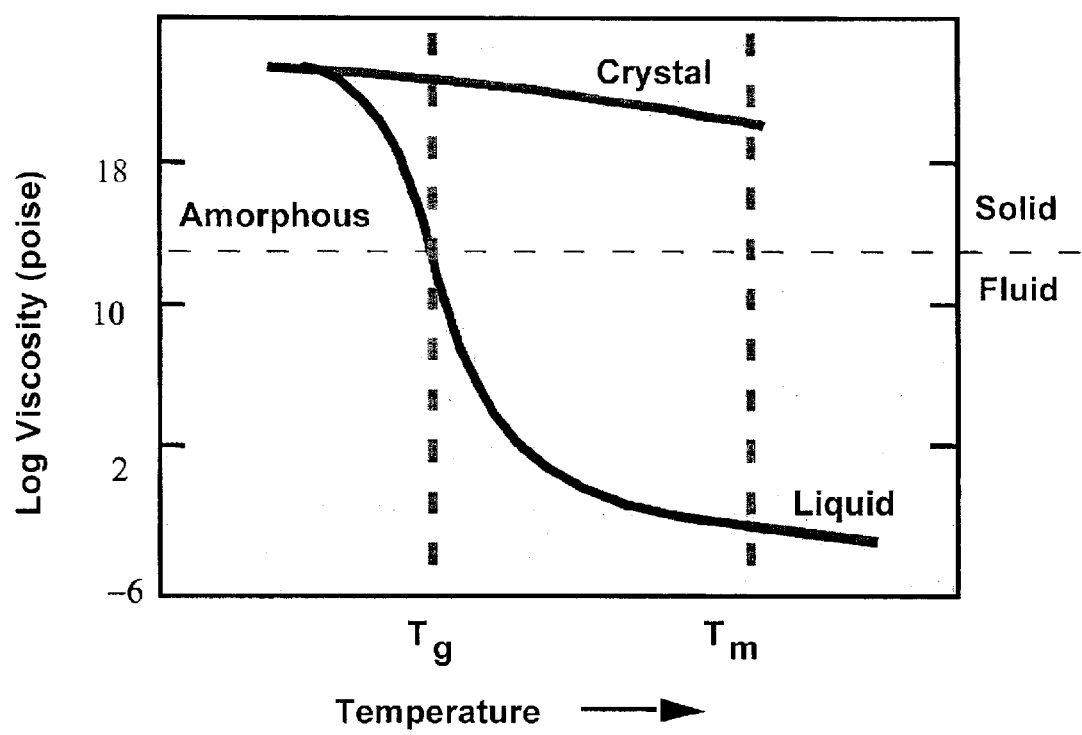
FIG. 12 shows a graphical comparison of the properties of the amorphous materials of the current invention and conventional materials.
Figure 13:
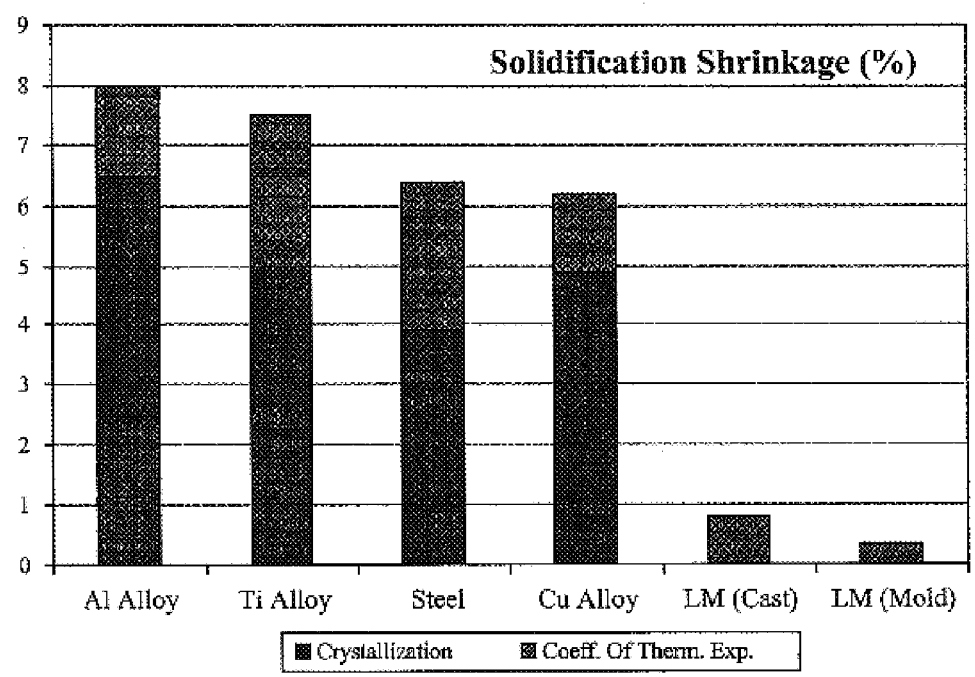
FIG. 13 shows a graphical comparison of the properties of the amorphous materials of the current invention and conventional materials.

In addition, because of the many different corners and angles required for most electronics frames and cases the amorphous alloy materials must be formable for an extended period of time. As shown in FIGS. 11 to 13, since bulk amorphous alloys retain their fluidity from above their melting temperatures down to glass transition temperatures, they do not accumulate significant stress down to below glass transition temperature. Further, the solidification shrinkage of bulk amorphous alloys is much less than solidification shrinkage of conventional metals. As such, these characteristics of bulk amorphous alloys can be molded or cast to reproduce the highly complex shapes associated with electronics cases without deformation and without requiring costly post-formation fabrication steps.

Accordingly, in one embodiment, only those bulk-solidifying amorphous having a ΔTsc (supercooled liquid region) of more than 30° C. as determined by Differential Scanning Calorimetry ("DSC") measurements at 20° C./min, and preferably a ΔTsc of more than 60° C., and still most preferably a ΔTsc of 90° C. or more, such that the material is capable of being formed at temperatures around the glass transition range for an extended period of time, are utilized. In such an embodiment, "around the glass transition range" means, the forming operation can be carried out above the glass transition, slightly below the glass transition or at the glass transition, but is at least carried out below the crystallization temperature Tx. To ensure that the final molded product retains the high elastic limit of the amorphous alloy feedstock, the temperature and time of molding process is preferably restricted according to the temperature maximums shown in Table 1, below (temperature units are in ° C.).

TABLE 1

| Molding Temperature Restrictions | | | |
| --- | --- | --- | --- |
| T | Tmax | Tmax (Pr.) | Tmax (M. Pr.) |
| Tsc > 90 | Tsc + ½ Tsc | Tsc + ¼ Tsc | Tsc |
| Tsc > 60 | Tsc + ¼ Tsc | Tsc | Tg |
| Tsc > 30 | Tsc | Tg | Tg-30 |

Where Tmax is the maximum permissible temperature during the molding process, Tmax (Pr.) is the preferred maximum permissible temperature, and Tmax (M. Pr.) is the most preferred maximum permissible temperature during the molding process.

In the above table, Tg, Tsc and Tx are determined from standard DSC scans at 20° C./min. Tg is defined as the onset temperature of glass transition, Tsc is defined as the onset temperature of super-cooled liquid region, and Tx is defined as the onset temperature of crystallization. ΔTsc is defined as the difference between Tx and Tsc. All the temperature units are in ° C.

One family of bulk-solidifying amorphous alloys, based on Zr and Ti satisfying the above mechanical, corrosion, and processability requirements is described by the following molecular formula: $(Zr, Ti)_a(Ni, Cu, Fe)_b(Be, Al, Si, B)_c$, where a is in the range of from about 30 to 75, b is in the range of from about 5 to 60, and c in the range of from about 0 to 50 in atomic percentages. It should be understood that the above formula by no means encompasses all classes of bulk-solidifying amorphous alloys. For example, such bulk-solidifying amorphous alloys can accommodate substantial concentrations of other transition metals, up to about 20% atomic percentage of transition metals such as Nb, Cr, V, Co. One exemplary bulk-solidifying amorphous alloy family is defined by the molecular formula: $(Zr, Ti)_a(Ni, Cu)_b(Be)_c$, where a is in the range of from about 40 to 75, b is in the range of from about 5 to 50, and c in the range of from about 5 to 50 in atomic percentages. One exemplary bulk-solidifying amorphous alloy composition is $Zr_{41}Ti_{14}Ni_{10}Cu_{12.5}Be_{22.5}$. A still more preferable composition is defined by: $(Zr, Ti)_a(Ni, CU)_b(Be)_c$, where a is in the range of from about 45 to 65, b is in the range of from about 7.5 to 35, and c in the range of from about 10 to 37.5 in atomic percentages. Another preferred non-Be Zr/Ti-based alloy family is defined by the formula $(Zr)_a(Nb, Ti)_b(Ni, Cu)_c(Al)_d$, where a is in the range of from 45 to 65, b is in the range of from 0 to 10, c is in the range of from 20 to 40, and d is in the range of from 7.5 to 15 in atomic percentages. In addition, these Zr/Ti-based bulk-solidifying amorphous alloys have very high corrosion resistance.

Another set of suitable bulk-solidifying amorphous alloys are compositions based on ferrous metals (Fe, Ni, Co). Examples of such compositions are disclosed in U.S. Pat. No. 6,325,868, (A. Inoue et. al., Appl. Phys. Lett., Volume 71, p 464 (1997)), (Shen et. al., Mater. Trans., JIM, Volume 42, p 2136 (2001)), and Japanese patent application 2000126277 (Publ. #0.2001303218 A), incorporated herein by reference. One exemplary composition of such alloys is $Fe_{72}Al_5Ga_2P_{11}C_6B_4$. Another exemplary composition of such alloys is $Fe_{72}Al_7Zr_{10}Mo_5W_2B_{15}$. Although, these alloy compositions are not as processable as Zr-base alloy systems, these materials can be still be processed in thicknesses around 0.5 mm or more, sufficient enough to be utilized in the current disclosure. In addition, although the density of these materials is generally higher, from 6.5 g/cc to 8.5 g/cc, the hardness of the materials is also higher, from 7.5 GPA to 12 GPa or more making them particularly attractive for some high wear applications. Similarly, these materials have elastic strain limit higher than 1.2% and yield strengths from 2.5 GPa to 4 GPa.

The Zr/Ti and Fe-based families of bulk-solidifying amorphous alloys are preferred for the construction of the electronics frames of the current invention because of these materials unique combination of physical properties.

As shown by the FIGS. 7 to 13, the bulk-solidifying amorphous alloys of the current invention can sustain strains up to 1.5% or more without any permanent deformation or breakage; and/or have a high fracture toughness of about 10 ksi-% in or more, and more specifically of about 20 ksi-% in or more; and/or have high hardness values of about 4 GPa or more, and more specifically about 5.5 GPa or more. In comparison to conventional materials, suitable bulk amorphous alloys have yield strength levels of up to about 2 GPa and more, exceeding the current state of the Titanium alloys.

In general, crystalline precipitates in bulk amorphous alloys are highly detrimental to the physical properties discussed above, especially to the toughness and strength, and as such generally preferred to a minimum volume fraction possible. However, there are cases in which ductile metallic crystalline phases precipitate in-situ during the processing of bulk amorphous alloys, these ductile precipitates can be beneficial to the properties of bulk amorphous alloys especially to the toughness and ductility. Accordingly, bulk amorphous alloys comprising such beneficial precipitates are also included in the current invention. One exemplary case is disclosed in (C. C. Hays et. al, Physical Review Letters, Vol. 84, p 2901, 2000), which is incorporated herein by reference.

Although pure bulk amorphous alloys are described above, they can also be produced in a variety of composite structures with other materials such as, for example, SiC, diamond, carbon fiber and metals such as Molybdenum. A variety of methods can be utilized to form these bulk amorphous matrix composites such as melt infiltration and thermoplastic forming. Composites of bulk amorphous metals are disclosed in U.S. Pat. Nos. 5,886,254 and 5,567,251 (each of whose disclosures is incorporated by reference in its entirety). Since, the bulk amorphous matrix composites may comprise a variety of reinforcement, such as carbon fiber, the mechanical properties may be tailored for specific needs. Although only a few examples are provided above, it should be understood that because the bulk amorphous matrix composites can comprise a variety of reinforcements, such as carbon fiber, the mechanical properties of these materials can be tailored for specific needs. For example, using the reinforcements of Carbon fiber such as up to 50% by volume, the density may be reduced as low as 3.5 g/cc and modulus of elasticity may be increased as high as 300 GPa providing a high specific stiffness (young modulus/density). Those numbers may be improved further with higher volume fractions of carbon fiber and other materials such as SiC particulates and fibers. More preferably, a mixed composites of bulk amorphous alloys may be made with combinations of carbon fibers, SiC particulates and other metals such as Molybdenum to provide exception combinations of flexural strengths up to 5 GPa and more, toughness and high modulus at substantially lower density of from 3 g/cc up to 6 g/cc. In such an embodiment, the reinforcement materials preferably are from 20% up to 80% of the composite by volume.

Although the above discussion does not detail the construction of the composite materials, it should be understood that the orientation and shape of the reinforcement materials may be tailored, for example, the materials may be aligned such that the desired properties (such as stiffness) are optimized in the direction parallel to length and width of the metal frame. In addition, the composite reinforcement materials may be provided in fiber, particulate, whisker, or other suitable shapes to tailor the properties of the material for a specified use.

The metal frame of bulk-solidifying amorphous alloys and composites may still be made to have an even higher hardness, and thus more durable by applying coatings of high refractory and high hardness materials such as diamond SiC with thickness of up to 0.010 mm. Since, the bulk-solidifying amorphous alloys will provide highly effective support for those thin coatings, they will be better protected against scratch and chip-off's.

In addition, the metal frames can be further treated to improve the metal frame's aesthetics and colors. For example, the metal frame may be subject to any suitable electrochemical processing, such as anodizing (electrochemical oxidation of the metal) to give desired colors such as blue, purple etc. for improved aesthetics. Since such anodic coatings also allow secondary infusions, (i.e. organic and inorganic coloring, lubricity aids, etc.), additional aesthetic or functional processing could be performed on the anodized metal frame. In such an embodiment, any suitable conventional anodizing process may be utilized.

Although the above discussion has focused on the use of bulk-solidifying amorphous alloy materials in the metal frames of the current invention, it should be understood that conventional materials may also be used in the construction of the other portions of the metal frames. For example, the inner or outer wall of the frame may include one or more decorative and protective layers generally made of a thermoplastic material, such as, a polyurethane, a polycarbonate, a polyamide, a polyamide coploymer, etc. In addition, there may be a filler core preferably made of a synthetic thermo-hardenable foam surrounded by an adhesive film to provide adhesion between the metal frame and an outer decorative or protective wall.

Figure 14:
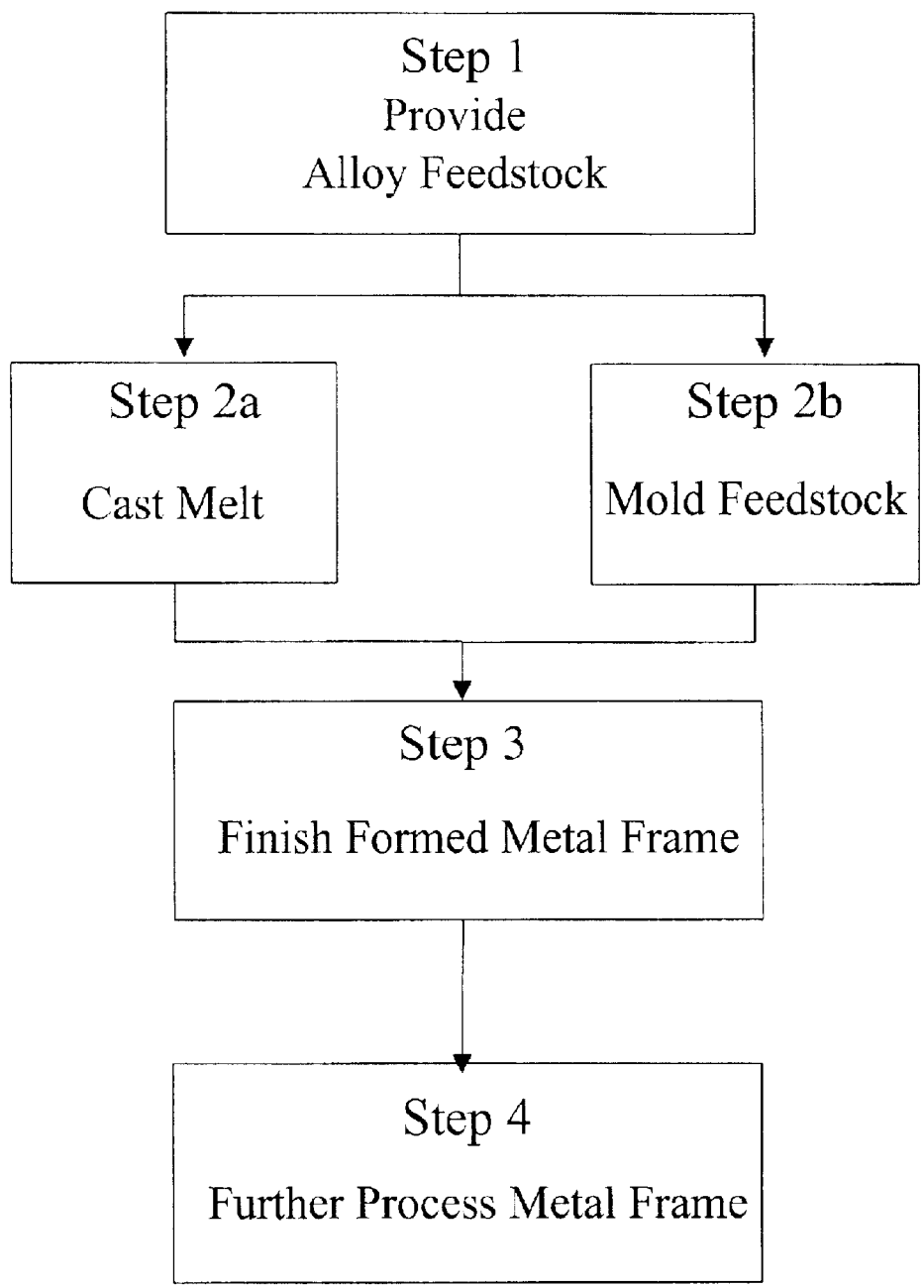
FIG. 14 is a flow-chart of a method for manufacturing a frame in accordance with one embodiment of the invention.

The invention is also directed to methods of manufacturing metal electronics frames from bulk-solidifying amorphous alloys. FIG. 14 shows a flow-chart for a process of forming the bulk-solidifying amorphous alloy articles of the invention comprising: providing a feedstock (Step 1), in the case of a molding process, this feedstock is a solid piece in the amorphous form, while in the case of a casting process, this feedstock is a molten liquid alloy above the melting temperatures; then either casting the feedstock from at or above the melt temperature into the desired shape while cooling (Step 2a), or heating the feedstock to the glass transition temperature or above and molding the alloy into the desired shape (Step 2b). Any suitable casting process may be utilized in the current invention, such as, permanent mold casting, die casting or a continuous process such as planar flow casting. One such die-casting process is disclosed in U.S. Pat. No. 5,711,363, which is incorporated herein by reference. Likewise, a variety of molding operations can be utilized, such as, blow molding (clamping a portion of feedstock material and applying a pressure difference on opposite faces of the unclamped area), die-forming (forcing the feedstock material into a die cavity), and replication of surface features from a replicating die. U.S. Pat. Nos. 6,027,586; 5,950,704; 5,896,642; 5,324,368; 5,306,463; (each of which is incorporated by reference in its entirety) disclose methods to form molded articles of bulk-solidifying amorphous alloys by exploiting their glass transition properties. Although subsequent processing steps may be used to finish the amorphous alloy articles of the current invention (Step 3), it should be understood that the mechanical properties of the bulk amorphous alloys and composites can be obtained in the as cast and/or molded form without any need for subsequent process such as heat treatment or mechanical working. In addition, in one embodiment the bulk-solidifying amorphous alloys and their composites are formed into complex near-net shapes in the two-step process. In such an embodiment, the precision and near-net shape of casting and moldings is preserved.

Alternatively, the metal frame may be fabricated from sheets of bulk-solidifying amorphous alloys and composites by stamping and/or die forming operations. Preferably the stamping and die-forming operations are performed around the glass transition temperatures as described in U.S. Pat. Nos. 5,324,368 and 5,896,642 (each of whose disclosures is incorporated by reference in its entirety). The metal frame may also be fabricated from sheets of bulk-solidifying amorphous alloys an composites by machining and cutting operations. Examples of preferred machining and cutting operations are water-jet, laser cutting, Electro Discharge machining. Preferably the stamping and die-forming operations are performed around the glass transition temperatures as described in U.S. Pat. Nos. 5,324,368, 5,324,368 and 5,896,642 (each of whose disclosures is incorporated by reference in its entirety). In addition, the metal frame may be machined, cut, stamped or die-formed with various slots and holes to provide improved cooling for the heat generated from the operation of electronic hardware, flat panel display. In such an embodiment, the metal frame may also be machined, cut, stamped or die-formed with various slots and holes to provide improved performance for internal sound system and speakers. Finally, in another such embodiment, the metal frame may be machined, cut, stamped or die-formed with various slots and holes to provide space for keyboard, mouse, track pad and other various accessories and other such attachments.

Regardless of the actual forming technique utilized, the remainder of the electronics frame is formed around the bulk-solidifying amorphous alloy components (Step 4) using conventional manufacturing techniques. For example, a method for forming an electronic frame for a portable computer according to the present invention is disclosed in U.S. Pat. No. 5,237,486, which is incorporated herein by reference.

Although relatively simple electronics frame designs are shown in FIGS. 1 to 5, it should be understood that utilizing such a near-net shape process for forming structures made of the bulk-solidifying amorphous metals and composites, more sophisticated and advanced designs of electronics frames composite structures having the improved mechanical properties could be achieved.

Although specific embodiments are disclosed herein, it is expected that persons skilled in the art can and will design alternative bulk-solidifying amorphous alloy electronic device frames and methods to produce the bulk-solidifying amorphous alloy electronic device frames that are within the scope of the following claims either literally or under the Doctrine of Equivalents.

What is claimed is:

1. A metal electronics frame comprising:
a body having walls defining at least one enclosure;
wherein the enclosure is designed to at least partially encase at least one electronic component, wherein at least a portion of the body is formed from a bulk-solidifying amorphous alloy material, and wherein the bulk-solidifying amorphous alloy material has an elastic limit of about 1.5% or greater.

2. The metal electronics frame as described in claim 1, wherein the bulk amorphous alloy is described by the following molecular formula: $(Zr,Ti)_a(Ni,Cu, Fe)_b(Be,Al,Si, B)_c$, wherein "a" is in the range of from about 30 to 75, "b" is in the range of from about 5 to 60, and "c" in the range of from about 0 to 50 in atomic percentages.

3. The metal electronics frame as described in claim 1, wherein the bulk-solidifying amorphous alloy is described by the following molecular formula: $(Zr,Ti)_a(Ni,Cu)_b(Be)_c$, wherein "a" is in the range of from about 40 to 75, "b" is in the range of from about 5 to 50, and "c" in the range of from about 5 to 50 in atomic percentages.

4. The metal electronics frame as described in claim 1, wherein the bulk-solidifying amorphous alloy is described by the following molecular formula: $(Zr)_a(Nb,Ti)_b(Ni,Cu)_c(Al)_d$, wherein "a" is in the range of from about 40 to 65, "b" is in the range of from about 0 to 10, "c" in the range of from about 20 to 30, and "d" is in the range of from 7.5 to 15 in atomic percentages.

5. The metal electronics frame as described in claim 1, wherein the bulk-solidifying amorphous alloy is described by the following molecular formula: $Zr_{41}Ti_{14}Ni_{10}Cu_{12.5}Be_{22.5}$.

6. The metal electronics frame as described in claim 1, wherein the bulk-solidifying amorphous alloy is described by a molecular formula selected from the group consisting of: $Fe_{72}Al_5Ga_2P_{11}C_6B_4$ and $Fe_{72}Al_7Zr_{10}Mo_5W_2B_{15}$.

7. The metal electronics frame as described in claim 1, wherein the bulk-solidifying amorphous alloy has a high fracture toughness of at least about 10 ksi-√in.

8. The metal electronics frame as described in claim 1, wherein the bulk-solidifying amorphous alloy has a high fracture toughness of at least about 20 ksi-√in.

9. The metal electronics frame as described in claim 1, wherein the bulk-solidifying amorphous alloy has a high hardness value of at least about 4 Gpa.

10. The metal electronics frame as described in claim 1, wherein the bulk-solidifying amorphous alloy has a high hardness value of at least about 5.5 GPa.

11. The metal electronics frame as described in claim 1, wherein the bulk-solidifying amorphous alloy has an elastic limit of at least about 2.0%.

12. The metal electronics frame as described in claim 1, wherein the bulk-solidifying amorphous alloy is based on ferrous metals selected from the group consisting of: Fe, Ni, and Co.

13. The metal electronics frame as described in claim 1, wherein the bulk-solidifying amorphous alloy has a yield strength of greater than 2.0 GPa or more.

14. The metal electronics frame as described in claim 1, wherein the bulk-solidifying amorphous alloy is based on ferrous metals selected from the group consisting of: Fe, Ni, and Co;
wherein the elastic limit of the bulk-solidifying amorphous alloy is about 1.5% and higher, the hardness of the bulk-solidifying amorphous alloy is about 7.5 GPa and higher.

15. The metal electronics frame as described in claim 1, wherein the bulk-solidifying amorphous alloy is based on ferrous metals selected from the group consisting of: Fe, Ni, and Co;
wherein the elastic limit of the bulk-solidifying amorphous alloy is about 1.5% and higher, the fracture toughness of the bulk-solidifying amorphous alloy is at least about 20 ksi-√in, and the density of the bulk-solidifying amorphous alloy is about 6.5 g/cc or less.

16. The metal electronics frame as described in claim 1, wherein the at least one portion formed from the bulk-solidifying amorphous alloy is designed with a support structure selected from the group consisting of ribs, honeycombs, and I-beams, such that the metal electronics frame does not undergo plastic deformation at strain levels of at least about 1.5%.

17. The metal electronics frame as described in claim 1, wherein the bulk-solidifying amorphous alloy further comprises a ductile metallic crystalline phase precipitate.

18. The metal electronics frame as described in claim 1, further comprises at least one opening.

19. The metal electronics frame as described in claim 18, wherein the opening is designed to allow access to the at least one electronic component.

20. The metal electronics frame as described in claim 1, wherein the electronics frame comprises at least two individual pieces.

21. The metal electronics frame as described in claim 20, wherein the two individual pieces of the metal electronics frame are either fixedly or moveable attached.

22. The metal electronics frame as described in claim 21, wherein the two individual pieces of the metal electronics frame are joined together by one of the connector from the group consisting of: adhesives, screws, and snap-connectors.

23. The metal electronics frame as described in claim 1, wherein at least a portion of the metal electronics frame is further coated with a high-hardened material selected from the group consisting of: TiN, SiC and diamond.

24. The metal electronics frame as described in claim 1, wherein at least the portion of the metal electronics frame made of the bulk-solidifying amorphous alloy is anodized.

25. The metal electronics frame as described in claim 1, wherein at least the portion of the metal electronics frame made of the bulk-solidifying amorphous alloy is anodized to provide rainbow colors.

26. The metal electronics frame as described in claim 1, wherein the at least one portion formed from the bulk-solidifying amorphous alloy has a thickness of at least 0.5 mm.

27. The metal electronics frame as described in claim 1, wherein the metal electronics frame is in the form of a case for a device selected from the group of: cellular phone, PDA, portable computer, and digital camera.

28. The metal electronics frame as described in claim 1, wherein the metal electronics frame provides at least partial electronic interference protection to the electronic component.

29. The metal electronic frame as described in claim 1, wherein the bulk-solidifying amorphous alloy material has a ratio of elastic limit to density of at least about 0.17.

30. The metal electronic frame as described in claim 1, wherein the bulk-solidifying amorphous alloy material has a ratio of yield strength to density of at least about 0.25.

31. The metal electronic frame as described in claim 1, wherein the bulk-solidifying amorphous alloy portion of the metal electronics frame has surface features of about 100 microns or less.

32. The metal electronic frame as described in claim 1, wherein the bulk-solidifying amorphous alloy material has a ΔTsc of more than 30° C.

33. The metal electronic frame as described in claim 1, wherein the bulk-solidifying amorphous alloy material has a ΔTsc of more than 60° C.

34. A metal electronics frame comprising:
a body having walls defining at least one enclosure;
wherein the enclosure is designed to at least partially encase at least one electronic component;
wherein at least a portion of the body is formed from a bulk-solidifying amorphous alloy material having an elastic limit of about 1.5% or greater and a ΔTsc of more than 30° C.; and
wherein the bulk-solidifying amorphous alloy also has at least two of the physical properties selected from the group consisting of: a yield strength of about 2.0 GPa or greater, a hardness of about 4.5 GPa or greater, a high fracture toughness of at least about 10 ksi-√in, and a density of from about 6.5 g/cc or less.

35. A metal electronics frame comprising:
a body having walls defining at least one enclosure;
wherein the enclosure is designed to at least partially encase at least one electronic component;

wherein at least a portion of the body is formed from a bulk-solidifying amorphous alloy material having an elastic limit of about 1.5% or greater and a ΔTsc of more than 30° C.; and wherein the bulk-solidifying amorphous alloy also has at least two of the physical properties selected from the group consisting of: a yield strength of about 2.0 GPa or greater, a hardness of about 5.5 GPa or greater, a high fracture toughness of at least about 20 ksi-√in, and a density of from about 6.5 g/cc or less.

36. A method of manufacturing a metal electronics frame comprising:

providing a blank from a bulk-solidifying amorphous alloy having an elastic limit of at least 1.5% and a ΔTsc of more than 30° C.;

heating the blank around the glass transition temperature of the bulk-solidifying amorphous alloy; and molding the blank to form at least a portion of a metal electronics frame to encase at least one electronic component.

37. The method as described in claim 36, wherein the bulk-solidifying amorphous alloy is described by the following molecular formula: $(Zr,Ti)_a(Ni,Cu)_b(Be)_c$, wherein "a" is in the range of from about 40 to 75, "b" is in the range of from about 5 to 50, and "c" in the range of from about 5 to 50 in atomic percentages.

38. The method as described in claim 36, wherein the bulk-solidifying amorphous alloy is described by the following molecular formula: $(Zr)_a(Nb,Ti)_b(Ni,Cu)_c(Al)_d$, wherein "a" is in the range of from about 40 to 65, "b" is in the range of from about 0 to 10, "c" in the range of from about 20 to 30, and "d" is in the range of from 7.5 to 15 in atomic percentages.

39. The method as described in claim 36, wherein the bulk-solidifying amorphous alloy is based on ferrous metals wherein the hardness of the bulk-solidifying amorphous alloy is about 7.5 GPa and higher, and the density of the bulk-solidifying amorphous alloy is about 8.5 g/cc or less.

40. The method as described in claim 36, wherein the bulk-solidifying amorphous alloy further comprises a ductile metallic crystalline phase precipitate.

41. The method as described in claim 36, wherein the entire metal electronics frame is formed of a bulk-solidifying amorphous alloy.

42. The method as described in claim 36, further comprising cutting the formed metal electronics frame to form at least one opening in the metal electronics frame to provide access to at least one of the at least one electronic component.

43. The method as described in claim 36, further comprising coating at least a portion of the metal electronics frame with a high hardness material selected from the group consisting of: SiC, diamond and TiN.

44. The method as described in claim 36, further comprising mounting a second metal electronics frame onto the metal electronics frame.

45. The method as described in claim 36, further comprising anodizing at least the portion of the metal electronics frame made of the bulk-solidifying amorphous alloy.

46. The method as described in claim 36, further comprising anodizing at least the portion of the metal electronics frame made of the bulk-solidifying amorphous alloy to provide one or more of a rainbow of colors.

47. The method as described in claim 36, wherein the hardness of the bulk-solidifying amorphous alloy is about 5.5 GPa and higher.

48. The method as described in claim 36, wherein the high fracture toughness of the bulk-solidifying amorphous alloy is at least about 10 ksi-√in.

49. The method as described in claim 36, wherein the density of the bulk-solidifying amorphous alloy is about 6.5 g/cc or less.

50. The method as described in claim 36, wherein the bulk-solidifying amorphous alloy material has a ratio of elastic limit to density of at least about 0.17.

51. The method as described in claim 36, wherein the bulk-solidifying amorphous alloy material has a ratio of yield strength to density of at least about 0.25.

52. The method as described in claim 36, wherein the elastic limit of the bulk-solidifying amorphous alloy is about 2.0% or higher.

53. The method as described in claim 36, wherein the step of shaping the blank further comprises replicating surface features of about 100 microns or less.

54. The metal electronic frame as described in claim 36, wherein the bulk-solidifying amorphous alloy material has a ΔTsc of more than 60° C.

55. A method of manufacturing a metal electronics frame comprising:

providing a blank from a bulk-solidifying amorphous alloy;

heating the blank around the glass transition temperature of the bulk-solidifying amorphous alloy; and molding the blank to form at least a portion of a metal electronics frame to encase at least one electronic component, wherein the bulk-solidifying amorphous alloy has an elastic limit of about 1.5% or greater, a ΔTsc of more than 30° C., and at least two of the physical properties selected from the group consisting of: a yield strength of about 2.0 GPa or greater, a hardness of about 4.0 GPA or greater, a high fracture toughness of at least about 10 ksi-√in, and a density of from about 6.5 g/cc or less.

56. A method of manufacturing a metal electronics frame comprising:

providing a blank from a bulk-solidifying amorphous alloy;

heating the blank around the glass transition temperature of the bulk-solidifying amorphous alloy; and molding the blank to form at least a portion of a metal electronics frame to encase at least one electronic component, wherein the bulk-solidifying amorphous alloy has an elastic limit of about 2.0% or greater, a ΔTsc of more than 60° C., and at least two of the physical properties selected from the group consisting of: a yield strength of about 2.0 GPa or greater, a hardness of about 5.5 GPA or greater, a high fracture toughness of at least about 20 ksi-√in, and a density of from about 6.5 g/cc or less.

57. A method of manufacturing a metal electronics frame comprising:

providing a feedstock in the form of a molten alloy above the melting temperature; and casting the feedstock to form a portion of a metal electronics frame of a bulk-solidifying amorphous alloy having an elastic limit of at least 1.5% and a ΔTsc of more than 30° C., wherein the metal electronics frame is designed to encase at least one electronic component.

58. The method as described in claim 57, wherein the bulk-solidifying amorphous alloy is described by the following molecular formula: $(Zr,Ti)_a(Ni,Cu)_b(Be)_c$, wherein "a" is in the range of from about 40 to 75, "b" is in the range of from about 5 to 50, and "c" in the range of from about 5 to 50 in atomic percentages.

59. The method as described in claim 57, wherein the bulk-solidifying amorphous alloy is described by the following molecular formula: $(Zr)_a(Nb,Ti)_b(Ni,Cu)_c(Al)_d$, wherein "a" is in the range of from about 40 to 65, "b" is in the range of from about 0 to 10, "c" in the range of from about 20 to 30, and "d" is in the range of from 7.5 to 15 in atomic percentages.

60. The method as described in claim 57, wherein the bulk-solidifying amorphous alloy is based on ferrous metals wherein the hardness of the bulk-solidifying amorphous alloy is about 7.5 GPa and higher, and the density of the bulk-solidifying amorphous alloy is about 8.5 g/cc or less.

61. The method as described in claim 57, wherein the bulk-solidifying amorphous alloy further comprises a ductile metallic crystalline phase precipitate.

62. The method as described in claim 57, wherein the entire metal electronics frame is formed of a bulk-solidifying amorphous alloy.

63. The method as described in claim 57, further comprising cutting the formed metal electronics frame to form at least one opening in the metal electronics frame to provide access to at least one of the at least one electronic component.

64. The method as described in claim 57, further comprising coating at least a portion of the metal electronics frame with a high hardness material selected from the group consisting of: SiC, diamond and TiN.

65. The method as described in claim 57, further comprising mounting a second metal electronics frame onto the metal electronics frame.

66. The method as described in claim 57, further comprising anodizing at least the portion of the metal electronics frame made of the bulk-solidifying amorphous alloy.

67. The method as described in claim 57, further comprising anodizing at least the portion of the metal electronics frame made of the bulk-solidifying amorphous alloy to provide one or more of a rainbow of colors.

68. The method as described in claim 57, wherein the hardness of the bulk-solidifying amorphous alloy is about 5.5 GPa and higher.

69. The method as described in claim 57, wherein the high fracture toughness of the bulk-solidifying amorphous alloy is at least about 10 ksi-√in.

70. The method as described in claim 57, wherein the density of the bulk-solidifying amorphous alloy is about 6.5 g/cc or less.

71. The method as described in claim 57, wherein the bulk-solidifying amorphous alloy material has a ratio of elastic limit to density of at least about 0.17.

72. The method as described in claim 57, wherein the bulk-solidifying amorphous alloy material has a ratio of yield strength to density of at least about 0.25.

73. The method as described in claim 57, wherein the elastic limit of the bulk-solidifying amorphous alloy is about 2.0% or higher.

74. The method as described in claim 57, wherein the step of shaping the blank further comprises replicating surface features of about 100 microns or less.

75. The metal electronic frame as described in claim 57, wherein the bulk-solidifying amorphous alloy material has a $\Delta Tsc$ of more than 60° C.

76. A method of manufacturing a metal electronics frame comprising:
providing a feedstock in the form of a molten alloy above the melting temperature; and
casting the feedstock to form a portion of a metal electronics frame of a bulk-solidifying amorphous alloy, wherein the metal electronics frame is designed to encase at least one electronic component,
wherein the bulk-solidifying amorphous alloy has an elastic limit of about 1.5% or greater, a $\Delta Tsc$ of more than 30° C., and at least two of the physical properties selected from the group consisting of: a yield strength of about 2.0 GPa or greater, a hardness of about 4.0 GPA or greater, a high fracture toughness of at least about 10 ksi-√in, and a density of from about 6.5 g/cc or less.

77. A method of manufacturing a metal electronics frame comprising:
providing a feedstock in the form of a molten alloy above the melting temperature; and
casting the feedstock to form a portion of a metal electronics frame of a bulk-solidifying amorphous alloy, wherein the metal electronics frame is designed to encase at least one electronic component,
wherein the bulk-solidifying amorphous alloy has an elastic limit of about 2.0% or greater, a $\Delta Tsc$ of more than 60° C., and at least two of the physical properties selected from the group consisting of: a yield strength of about 2.0 GPa or greater, a hardness of about 5.5 GPA or greater, a high fracture toughness of at least about 20 ksi-√in, and a density of from about 6.5 g/cc or less.

\* \* \* \* \*